United States Patent [19]

Ruelke

[11] Patent Number: 5,574,413

[45] Date of Patent: Nov. 12, 1996

[54] TUNABLE FILTER HAVING A CAPACITIVE CIRCUIT CONNECTED TO GROUND

[75] Inventor: Charles R. Ruelke, Davie, Fla.

[73] Assignee: Motorola, Inc., Schaumburg, Ill.

[21] Appl. No.: 397,458

[22] Filed: Mar. 2, 1995

[51] Int. Cl.⁶ .................................................. H03H 7/12
[52] U.S. Cl. .................................... 333/174; 333/168
[58] Field of Search .......................... 333/17.1, 246, 333/168, 174, 175; 334/15

[56] References Cited

U.S. PATENT DOCUMENTS

| | | | |
|---|---|---|---|
| 3,049,682 | 8/1962 | Waring | 333/174 |
| 4,430,630 | 7/1984 | Sakamoto | 334/15 |
| 4,586,007 | 4/1986 | Ciszek | 333/175 |
| 4,839,617 | 6/1989 | Speake | 333/174 |
| 5,150,085 | 9/1992 | Hales | 333/174 |
| 5,202,656 | 4/1993 | Clark et al. | 333/174 |
| 5,285,179 | 2/1994 | Wignot et al. | 334/15 |
| 5,376,907 | 12/1994 | Duflot et al. | 333/174 |

FOREIGN PATENT DOCUMENTS

| | | | |
|---|---|---|---|
| 2216516 | 9/1987 | Japan | 333/175 |
| 2247125 | 2/1992 | United Kingdom | 333/207 |

*Primary Examiner*—Benny Lee
*Assistant Examiner*—Justin P. Bettendorf
*Attorney, Agent, or Firm*—Andrew S. Fuller

[57] ABSTRACT

A tunable filter (100) includes first and second resonant structures (140, 145) coupled by a capacitive coupler (120). The capacitive coupler (120) includes two tunable elements (121, 126) coupled by a capacitive circuit formed at least in part by a capacitive pi-network (130).

14 Claims, 2 Drawing Sheets

TUNABLE FILTER HAVING A CAPACITIVE CIRCUIT CONNECTED TO GROUND

TECHNICAL FIELD

This invention relates in general to filters, and more particularly, to tunable filters such as those used in radio receivers.

BACKGROUND OF THE INVENTION

Radio communication devices often use filters for a wide variety of applications. In one such example, a bandpass filter is used in determining the selectivity of a radio receiver. Bandpass filters vary in structure and composition. Most bandpass filters include reactively coupled resonators, whose resonant characteristics define the filter's center frequency of operation and selectivity response. Generally, the resonators are coupled to each other by reactive components such as capacitors, inductors, or combinations thereof. A number of factors, including the type and number of resonators in the filter help determine the selectivity of a filter.

Bandpass filters may have fixed or tunable pass band center frequencies. Filters having fixed center frequencies are usually used in narrow band receivers with the operational frequencies limited to a narrow radio frequency (RF) bandwidth. On the other hand, filters having a tunable pass band frequency responses may be used in wide band receivers where the range of the operational frequency covers a substantially large bandwidth. Tunable filters are particularly suitable in reducing manufacturing costs of radio communication devices as a single circuit can be used to cover a wide frequency band, thus eliminating the need for multiple designs covering only portions of a frequency band.

A filter may be tuned by adjusting the value of selected reactive elements within the filter's topology. Generally, reactive values are changed through electronic components whose reactive characteristics are dependent upon voltage or current sources. For example, variable reactance can be accomplished through electrical components whose capacitive characteristics are dependent upon a bias voltage. Many tunable filters are varactor based. A resonator within the filter may include a tuning element having one or more varactors which respond to a control voltage to provide tuning for the filter. By varying the control voltage, the filter may be tuned to provide a particular pass band center frequency for a desired frequency of operation. A typical prior art tunable filter includes two resonators, coupled by back-to-back varactors, such that upon simultaneous application of a control voltage, the center frequencies of the resonators are varied. Accordingly, the tuning elements receive identical control voltages, and as these control voltages vary, the filter is tuned for a desired frequency response.

In designing a tunable filter, many tradeoffs must be made between costs, complexity, and performance characteristics. Moreover, adjustments in portions of the design to improve one performance characteristic, may have a negative effect on another performance characteristic.

A bandpass filter (BPF) typically consists of multiple resonator structures that are reactively coupled together to achieve the desired RF filter response. A BPF provides a low insertion loss for signals within a particular pass band frequency range, and rejects signals that are outside the pass band. One known implementation uses a capacitive element as a coupler between pairs of inductive resonator structures.

The coupling factor between the resonator structures is determined by the capacitive value of the coupler and is indicative of the loading of the resonator structure. A high series capacitor value results in a low series reactive impedance, which increases the loading effects of the inductive resonator structures. Conversely, a low series capacitive value results in a high series reactive impedance which provides for less coupling, and consequently less loading of the resonator structures. Varying the coupling by utilizing varactor diodes is typical in the art. To mitigate the non-linear response of a varactor, a filter is ordinarily designed to utilize only the linear range of the varactor response. This can require additional circuitry to generate higher control voltages to provide adequate tuning.

It is desirable to have a filter, such as the bandpass filter, that provides a linear response to tuning. Prior art filter designs utilizing low cost components, such as varactors provide limited tuning capabilities without additional costly circuitry. Therefore, a new approach to the design of tunable filters is required.

DETAILED DESCRIPTION OF THE PREFERRED EMBODIMENT

Figure 1:
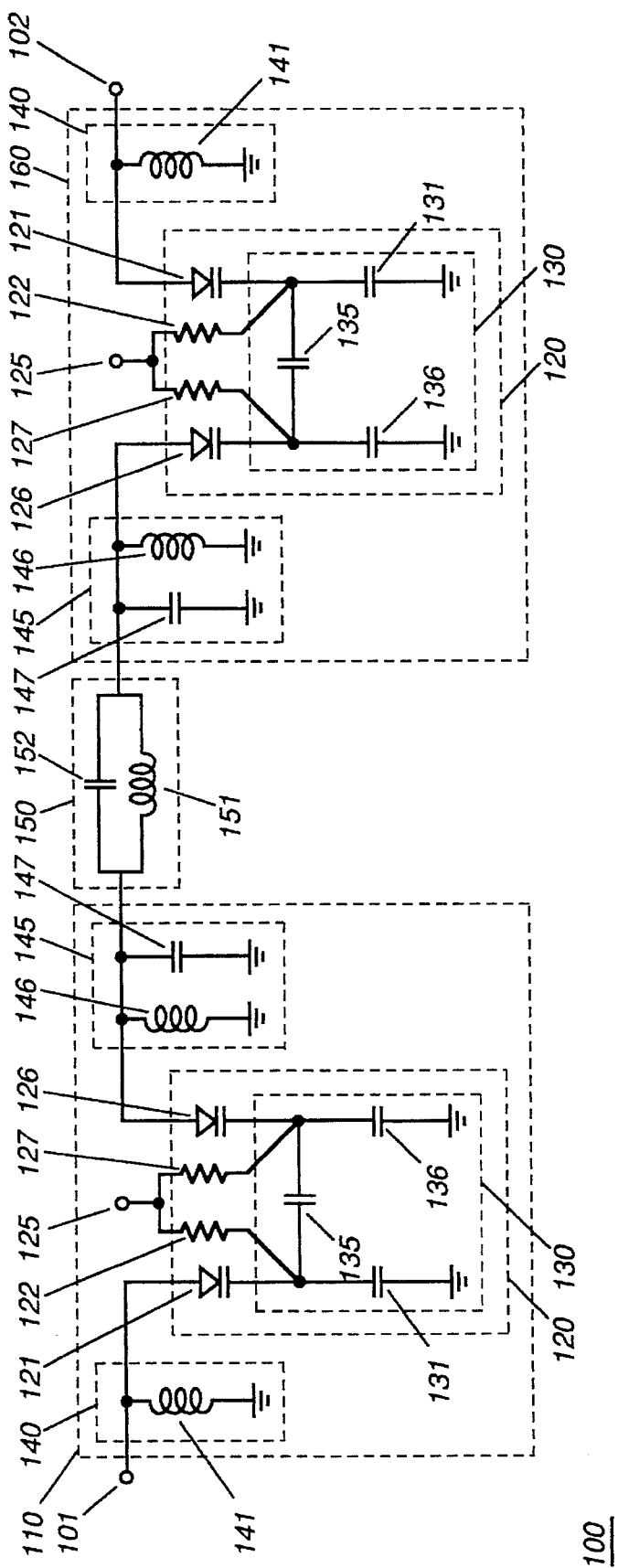
FIG. 1 is a schematic diagram of a tunable filter, in accordance with the present invention.

While the specification concludes with claims defining the features of the invention that are regarded as novel, it is believed that the invention will be better understood from a consideration of the following description in conjunction with the drawing figures, in which like reference numerals are carried forward.

Generally, the present invention provides for a linearized tunable filter suitable for use in applications such as bandpass filters and the like. In the tunable filter, resonator structures are coupled by a capacitive coupler which includes at least two tunable elements, such as varactors, having an undesired non-linear response. The capacitive coupler has a capacitive tap topology that preferably includes a pi-network of fixed-value capacitors to linearize the tuning response.

Referring to FIG. 1, a schematic diagram of the tunable filter 100 is shown, in accordance with the present invention. The tunable filter 100 is a radio frequency (RF) bandpass filter, such as may be found in a receiver for a radio communication device. The filter 100 includes an input port 101 and an output port 102 coupled to main resonator structures 110, 160 that are reactively coupled, as is typical. The reactive coupler coupling the main resonator structures 110, 160 is a tank circuit 150 of an inductor 151 and a capacitor 152 coupled in parallel, as is well known in the art. Each main resonator structure 110, 160 comprises a tunable circuit, including a tunable element, which may be tuned to resonate at a specific center frequency. The tunable elements include varactors 121, 126 that are coupled in series in a back-to-back configuration by a capacitive circuit 130 which will be described in more detail below. The varactors 121, 126 are variable capacitive tuning elements that each have a positive terminal, i.e., a cathode. As can be seen from the schematic depicted, the capacitive circuit 130 is coupled to the varactors 121, 126 at their respective positive terminals, i.e., at the cathodes. A control signal 125 in the form of a control voltage, is used to tune the behavior of the tunable elements 121, 126. The control signal 125 is provided to each tunable element 121, 126, through a high impedance resistor 122, 127 which provides RF filtering for the control signal 125 in a well known manner.

In the preferred embodiment, each main resonator structure 110 includes two inductive resonant structures or circuits 140, 145 coupled in series by a capacitive coupler 120. A first inductive resonant structure 140 comprises an inductor 141 shunted to ground, and a second inductive resonant structure 145 comprises a inductor 146 and a capacitor 147 coupled in parallel and shunted to ground. As is well known in the art, a practical inductor can be modeled as a distributed LC element. Inductor 141 is therefore selected to have the desired resonant characteristics. The properties of the components of the first and second resonator structures 140, 145 are appropriately selected to present a particular impedance. The capacitive coupler circuit 120 includes the two tunable elements 121, 126. The first inductive resonant structure 140 is coupled to the input of a first tunable element 121 of the capacitive coupler 120, and the second inductive resonant structure 145 is coupled to the input of a second tunable element 126. Both tunable elements 121, 126 are coupled in series by a capacitive pi-network 130.

In the preferred embodiment, the tunable elements 121, 126 are varactors, which are variable capacitance elements having a non-linear response. According to the present invention, the non-linear response of the varactors 121, 126 are linearized using a capacitive tap topology, i.e., the non-linear variable capacitance of the varactor is linearized by the parallel transformation of a series capacitor combination.

Each varactor 121, 126 is coupled in series to a shunted capacitor 131, 136, which is preferably a fixed-value lumped element capacitor. The two tunable elements 121, 126 are coupled to each other by an additional fixed value capacitor 135 at the junction of the dual capacitive tap structure formed by varactor 121 with capacitor 131, and by varactor 126 with capacitor 136. Accordingly, the main coupling between the inductive resonator structures 140, 145 is achieved through a combination of varactors 121, 126 and fixed-value capacitors 131, 135, 136. The capacitors 131, 135, 136 form the capacitive pi-network 130 mentioned herein. The fixed-value capacitors 131, 135, 136 function as linear elements that serve to linearized the non-linearities of the varactors 121, 126 through series capacitive tap structures whose composite response is equivalent to parallel reactance transformations. The use of fixed-value capacitors allow for minimal impact on the quality factor (Q) of the resonator, as the fixed capacitor's quality factor is typically significantly higher than that of the inductors. The linearization of the varactors allows for full utilization of low voltages, typically less than 5 volts, to tune the filter 100 by equalizing tune sensitivity at both high and low control voltages.

The capacitive coupling circuitry 120 of the present invention, can also be viewed as a capacitive tap impedance transformer. The capacitive tap topology described exhibits a transfer function in which the input impedance is transformed down as a function of the network's voltage transfer function. The capacitive tap topology formed by varactor 121 and capacitor 131, followed by capacitors 135 and 136, and varactor 126 and capacitor 136 followed by capacitors 135 and 131, exhibit a bilateral transfer function equal to two series impedance transformers. The result is a broad band impedance transformer in which the non-linear effects of the varactors is mitigated by transforming the varactors reactive non-linearity at the impedance transformer's input to a smaller range at the transformer's output. The result is the varactor's reactance over the same control voltage is compressed; thus the control voltage range must be expanded to achieve the same reactive coupling factor. The effect of expanding the required control voltage to achieve the same reactive coupling element is equivalent to linearizing the varactor non-linearities.

The varactor linearization, whether viewed as a dual impedance transformer, or as a parallel transformation of the dual series capacitor tap topology, is achieved according to the present invention, with minimal degradation and resonator Q. Control voltage requirements are simplified by achieving the varactor linearity at a low voltage thereby eliminating the need for complicated control circuitry. This improved linearization contributes to better control of a filter's coupling factor as a function of control voltage, which in turns improves filter tunability and design reliability.

Figure 2:
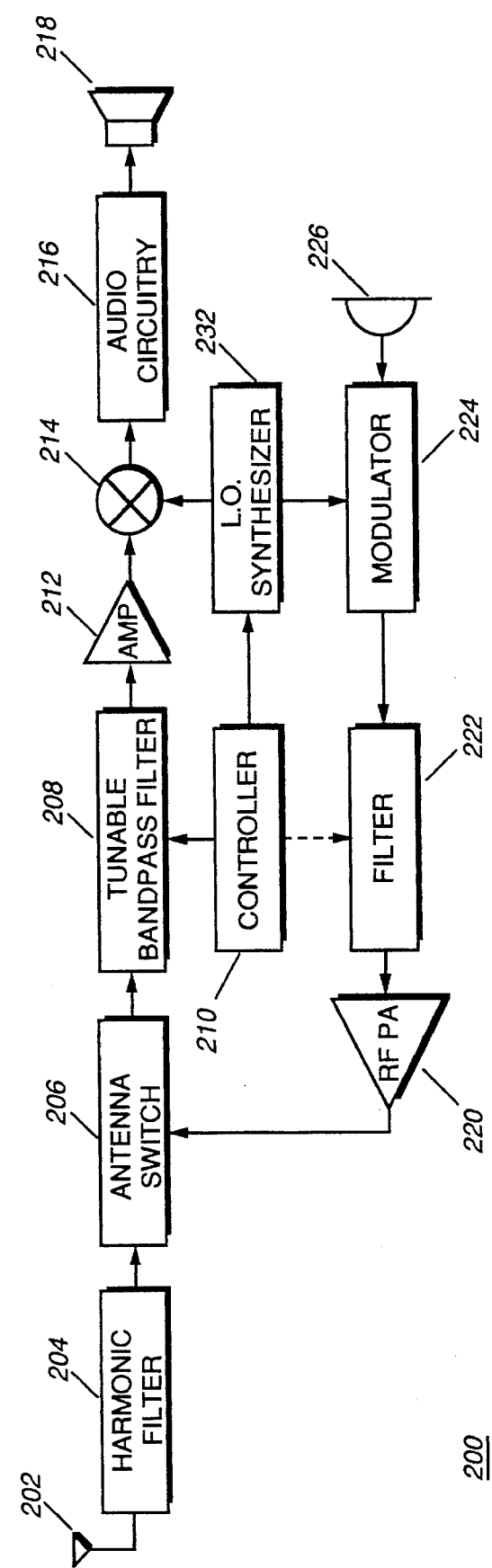
FIG. 2 is a block diagram of a radio utilizing the tunable filter of FIG. 1, in accordance with the present invention.

Referring to FIG. 2, a block diagram of a radio is shown which incorporates the tunable filter, in accordance with the present invention. The radio is a portable two-way radio capable of operating in receive and transmit modes to communicate using radio frequency signals. In receive mode, the radio 200 receives a communication signal via an antenna 202. The received communication signal is coupled to a tunable filter 208 via a harmonic filter 204 and an antenna switch 206. The filter 208 is a tunable filter, in accordance with the present invention, which provides radio front-end selectivity for the received communication signal. The output of the filter 208 is applied to an amplifier 212, and a mixer 214. The mixer 214 receives a receiver local oscillator (LO) injection signal from an LO synthesizer 232 to produce an intermediate frequency (IF). The IF signal is applied to a well-known audio section 216 which, among other things, amplifies audio signals and presents them to a speaker 218. The tuning control voltage (CV) is provided by a controller 210 which also provides operational control for the radio 200 in a well-known manner.

In transmit mode, an audio signal provided by a microphone 226, and applied to a well-known modulator section 224 to provide a modulated signal to a filter 222. The modulator section 224 also receives a transmit local oscillator signal from the local oscillator synthesizer 232. Although the tunable filter of the present invention is particular suitable for providing front end selectivity for receiver, it may be appreciated that a transmitter section may also be advantageously utilize a tunable filter. Accordingly, the filter 222 may also be responsive to the controller 210 for selecting a desired bandwidth. A transmitter power amplifier 220 amplifies the output of the filter 222 and applies it to the antenna 202 through the antenna switch 206 for transmission of a communication signal.

The present invention offers significant advantages over the prior art. The bandpass filter provides improved tuning flexibility without complex additional circuitry. Varactor non-linearity at low control voltages is minimized without significantly degrading the quality factor of the filter's resonant structures. The principles of the present invention, therefore, provide a simple solution to a significant problem encountered in prior art filters.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A tunable filter, comprising:

first and second resonant structures coupled by a capacitive coupler, the capacitive coupler comprising:
  first and second variable capacitive tuning elements, each having a positive terminal; and
  a capacitive circuit coupling the variable capacitive tuning elements, the capacitive circuit comprising a capacitive pi-network coupled at the positive terminals of the variable capacitive tuning elements, the capacitive pi-network having at least one element directly electrically connected to ground.

2. The tunable filter of claim 1, wherein the capacitive pi-network comprises linear elements.

3. The tunable filter of claim 1, wherein the capacitive circuit includes impedance transformation circuitry.

4. The tunable filter of claim 1, wherein the capacitive pi-network comprises fixed-value capacitors, wherein at least one of the fixed-value capacitors is connected to electrical ground.

5. The tunable filter of claim 4, wherein the capacitive pi-network comprises:

first and second shunted capacitors coupled in series from electrical ground to the positive terminals of the first and second variable capacitive tuning elements, respectively; and a third capacitor coupled in series between the positive terminals of the first and second variable capacitive tuning elements.

6. A linearized tunable filter, comprising:

first and second resonators coupled by a capacitive circuit, the capacitive circuit comprising:
  first and second variable capacitive tuning elements each having a non-linear response, each variable capacitive tuning element having a positive terminal;
  first and second shunted capacitors being directly connected between electrical ground and the positive terminal of the first and second variable capacitive tuning elements, respectively; and
  a third capacitor coupled in series between the first and second variable capacitive tuning elements.

7. The linearized tunable filter of claim 6, wherein the variable capacitance element comprises a varactor.

8. The linearized tunable filter of claim 6, wherein the first and second shunted capacitors comprise fixed-value capacitors.

9. The linearized tunable filter of claim 6, wherein the third capacitor comprise a fixed-value capacitor.

10. A tunable filter, comprising:

a first resonator circuit;

a second resonator circuit, comprising:
  first and second inductive resonators coupled by a capacitive circuit,
  the capacitive circuit comprising:
    first and second varactors, each having a cathode;
    first and second capacitors being shunted directly to ground, and being coupled in series to the cathode of the first and second varactors, respectively;
    a third capacitor coupled in series with the cathodes of the first and second varactors; and coupling means for coupling the first and second resonator circuits.

11. A radio comprising:

a radio receiver, the radio receiver including a tunable circuit, the tunable circuit comprising first and second resonant structures interconnected by a capacitive coupler, the capacitive coupler comprising:
  first and second variable capacitive tuning elements, each having a positive terminal; and
  a capacitive circuit coupling the first and second variable capacitive tuning elements, the capacitive circuit having a capacitive pi-network coupled at the positive terminals of the variable capacitive tuning elements, and having at least one element of the capacitive pi-network directly connected to ground.

12. The radio of claim 11, wherein the capacitive pi-network comprises linear elements.

13. The radio of claim 11, wherein the capacitive pi-network comprises fixed-value capacitors.

14. The radio of claim 13, wherein the capacitive pi-network of fixed-value capacitors comprises:

first and second shunted capacitors coupled in series from electrical ground to the positive terminals of the first and second variable capacitive tuning elements, respectively; and a third capacitor coupled in series with the positive terminals of the first and second variable capacitive tuning elements.

* * * * *